United States Patent
Kazama et al.

(10) Patent No.: US 11,464,142 B2
(45) Date of Patent: Oct. 4, 2022

(54) IMAGE DISPLAY DEVICE

(71) Applicant: Panasonic Intellectual Property Management Co., Ltd., Osaka (JP)

(72) Inventors: Masato Kazama, Osaka (JP); Tadahiro Kugimaru, Osaka (JP); Yoshitoshi Ooki, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 17/051,759

(22) PCT Filed: Mar. 10, 2020

(86) PCT No.: PCT/JP2020/010164
§ 371 (c)(1),
(2) Date: Oct. 29, 2020

(87) PCT Pub. No.: WO2020/217751
PCT Pub. Date: Oct. 29, 2020

(65) Prior Publication Data
US 2021/0127531 A1 Apr. 29, 2021

(30) Foreign Application Priority Data
Apr. 24, 2019 (JP) .............................. JP2019-082827

(51) Int. Cl.
*H05K 7/20* (2006.01)
*H05K 5/00* (2006.01)

(52) U.S. Cl.
CPC ....... *H05K 7/20963* (2013.01); *H05K 5/0017* (2013.01)

(58) Field of Classification Search
CPC ........ G06F 1/1601; G06F 1/1637; G06F 1/20; H05K 5/0017; H05K 5/20963
See application file for complete search history.

(56) References Cited

U.S. PATENT DOCUMENTS

| 8,184,229 B2 * | 5/2012 | Nagaoka | ........... G02F 1/133604 349/56 |
| 10,019,116 B2 * | 7/2018 | Uriu | ...................... G06F 3/0445 |

(Continued)

FOREIGN PATENT DOCUMENTS

| JP | 2013-195510 A | 9/2013 |
| JP | 2018-40850 A | 3/2018 |

OTHER PUBLICATIONS

International Search Report issued in corresponding International Patent Application No. PCT/JP2020/010164, dated Jun. 9, 2020.

*Primary Examiner* — Jacob R Crum
(74) *Attorney, Agent, or Firm* — McDermott Will & Emery LLP (57) ABSTRACT

An image display device includes: a display panel which displays an image on a front surface of the display panel; a heat diffusing plate on a rear side of the display panel; and a frame along an edge surface of the display panel and an edge surface of the heat diffusing plate. The frame includes: a side wall which is disposed opposite to the edge surface of the display panel and the edge surface of the heat diffusing plate; and a support wall which projects from the side wall toward the heat diffusing plate. The heat diffusing plate includes a peripheral portion between the support wall and the display panel. The peripheral portion includes, on a rear side, a stepped portion which houses at least part of support wall.

12 Claims, 5 Drawing Sheets

(56) References Cited

U.S. PATENT DOCUMENTS

| | | | |
|---|---|---|---|
| 2008/0150851 A1* | 6/2008 | Takaira | G06F 1/1601 |
| | | | 345/84 |
| 2015/0333285 A1* | 11/2015 | Ogasawara | H01L 51/5246 |
| | | | 257/40 |
| 2015/0355504 A1* | 12/2015 | Uchimi | G02F 1/133308 |
| | | | 349/58 |
| 2018/0039128 A1* | 2/2018 | Lee | G02B 6/0085 |
| 2019/0129236 A1* | 5/2019 | Kim | H04M 1/0266 |

\* cited by examiner

IMAGE DISPLAY DEVICE

CROSS-REFERENCE OF RELATED APPLICATIONS

This application is the U.S. National Phase under 35 U.S.C. § 371 of International Patent Application No. PCT/JP2020/010164, filed on Mar. 10, 2020, which in turn claims the benefit of Japanese Patent Application No. 2019-082827, dated Apr. 24, 2019, the entire disclosures of which Applications are incorporated by reference herein.

TECHNICAL FIELD

The present disclosure relates to an image display device which includes a display panel which displays an image.

BACKGROUND ART

Patent Literature (PTL) 1 discloses a display device which includes liquid crystal panel as a display panel and a back light device as an external light source. The liquid crystal panel and the back light device are integrally held by a frame and a chassis which configure an appearance of the display device.

CITATION LIST

Patent Literature

[PTL 1] Japanese Unexamined Patent Application Publication No, 2013-195510

SUMMARY OF INVENTION

Technical Problem

The present disclosure provides an image display device which has enhanced heat dissipation properties while reducing an increase in thickness.

Solution to Problem

An image display device according to the present disclosure includes: a display panel which displays an image on a front surface of the display panel; a heat diffusing plate which is disposed on a rear side of the display panel; and a frame which is disposed along an edge surface of the display panel and an edge surface of the heat diffusing plate. The frame includes: a side wall which is disposed opposite to the edge surface of the display panel and the edge surface of the heat diffusing plate; and a support wall which projects from the side wall toward the heat diffusing plate. The heat diffusing plate includes a peripheral portion which is disposed between the support wall and the display panel, and the peripheral portion includes a stepped portion on a rear side of the peripheral portion, the stepped portion housing at least part of the support wall.

Advantageous Effects of Invention

The present disclosure provides an image display device which has enhanced heat dissipation properties while reducing an increase in thickness.

DESCRIPTION OF EMBODIMENTS

The inventors of the present application have found the following problems related to a conventional image display device. For example, a conventional television receiver is known which includes a display panel (organic electroluminescent (EL) panel) with organic light-emitting diodes (OLEDs).

The organic EL panel is a self-emitting display panel which does not require a backlight unit unlike a liquid, crystal panel. Accordingly, the thickness of a display panel module including the organic EL panel can be reduced compared with a display panel module including the liquid crystal panel. However, the organic EL panel generates heat by light emission. The generated heat causes degradation of the OLED elements (temperature degradation). Accordingly, a configuration is required which efficiently dissipates the heat of the organic EL panel to the outside.

In order to address the problem, for example, a heat diffusing plate made of a material having a high thermal conductivity, such as metal, is disposed on the rear surface of the organic EL panel. In such a case, a frame which supports the peripheral portion of the organic EL panel is configured to support the peripheral portion of the organic EL panel from the rear side to, for example, narrow the frame. In other words, a portion of the frame (a support) which supports the peripheral portion of the organic EL panel is disposed an the rear surface of the peripheral portion of the organic EL panel. Moreover, in order to reduce an increase in thickness of the display panel module, the heat diffusing plate is disposed in the inner region of the support so as not to overlap the support. Accordingly, the heat diffusing plate is not disposed on the rear side of the peripheral portion of the organic EL panel. This leads to tower heat dissipation properties than the heat dissipation properties of the portion where the heat diffusing plate is disposed. As a result, for example, the temperature degradation in the peripheral portion of the organic EL panel progresses compared to the other portions, which is likely to cause reduction is brightness or contrast in the peripheral portion.

The present disclosure has been conceived in view of the above finding. As a result of intensive studies by the inventors of the present application, the inventors have arrived at an idea of an image display device which has enhanced heat dissipation properties while reducing an increase in thickness.

Hereinafter, an embodiment will be described with reference to the drawings as necessary. Note that unnecessarily detailed descriptions may be omitted. For example, detailed descriptions of already known matters and overlapping description of substantially the same configuration may be omitted. This is to avoid the following description to become unnecessarily redundant, and to facilitate understanding of the person skilled in the art.

The inventors of the present application provide the accompanying drawings and the following description so that the person skilled in the art fully understands the present disclosure, and do not intend to limit the subject matter of the claims by this.

Moreover, in the following embodiment and variations, the top-bottom direction is represented by the Z-axis, the front-back direction is represented by the Y-axis, and the left-right direction is represented by the X-axis for the sake of description, but these do not limit the orientation of the image display device according to the present disclosure at the time of manufacture or usage. In the following descriptions, for example, the positive X-axis side indicates the direction of the arrow of the X-axis and the negative X-axis side indicates the direction opposite to the positive X-axis side. The same applies to the Y-axis and the Z-axis. Note that, the drawings are represented schematically, and are not necessarily precise illustrations. As such, the scaling, etc., depicted in the drawings is not necessarily accurate.

Embodiment

[1. Outline of Configuration of Image Display Device]

Figure 1:
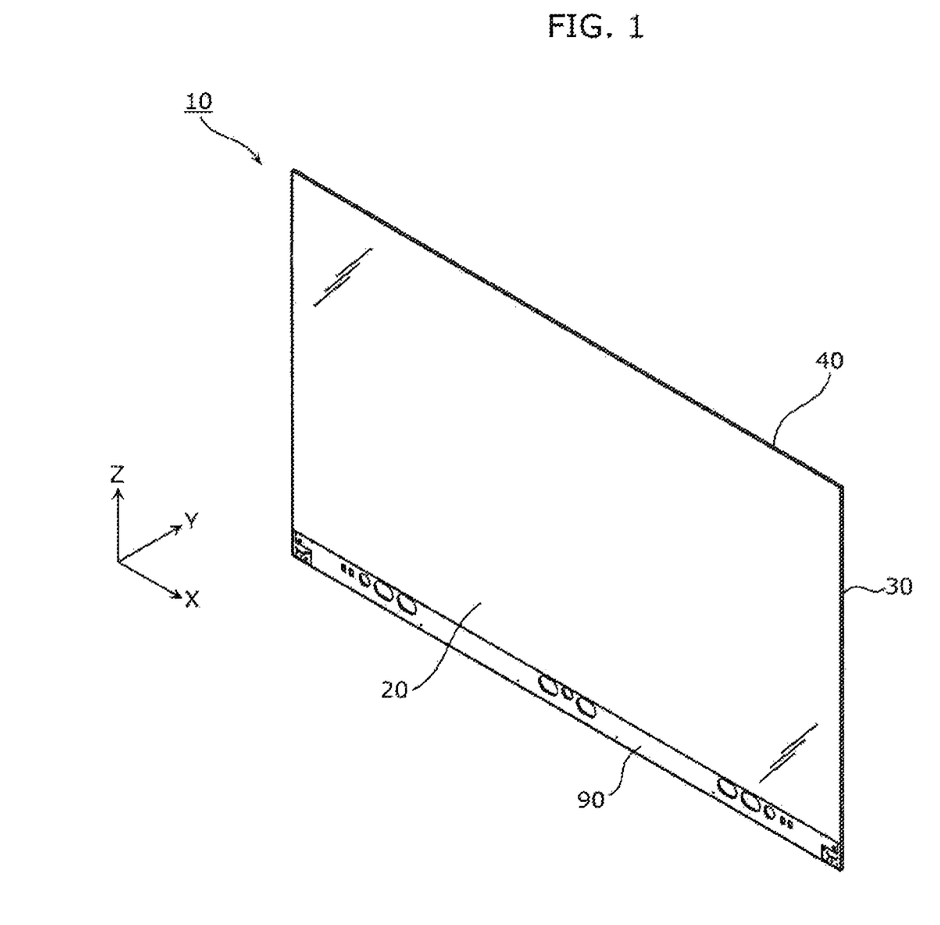
FIG. 1 is an external perspective view of n image display device according to an embodiment.
Figure 2:
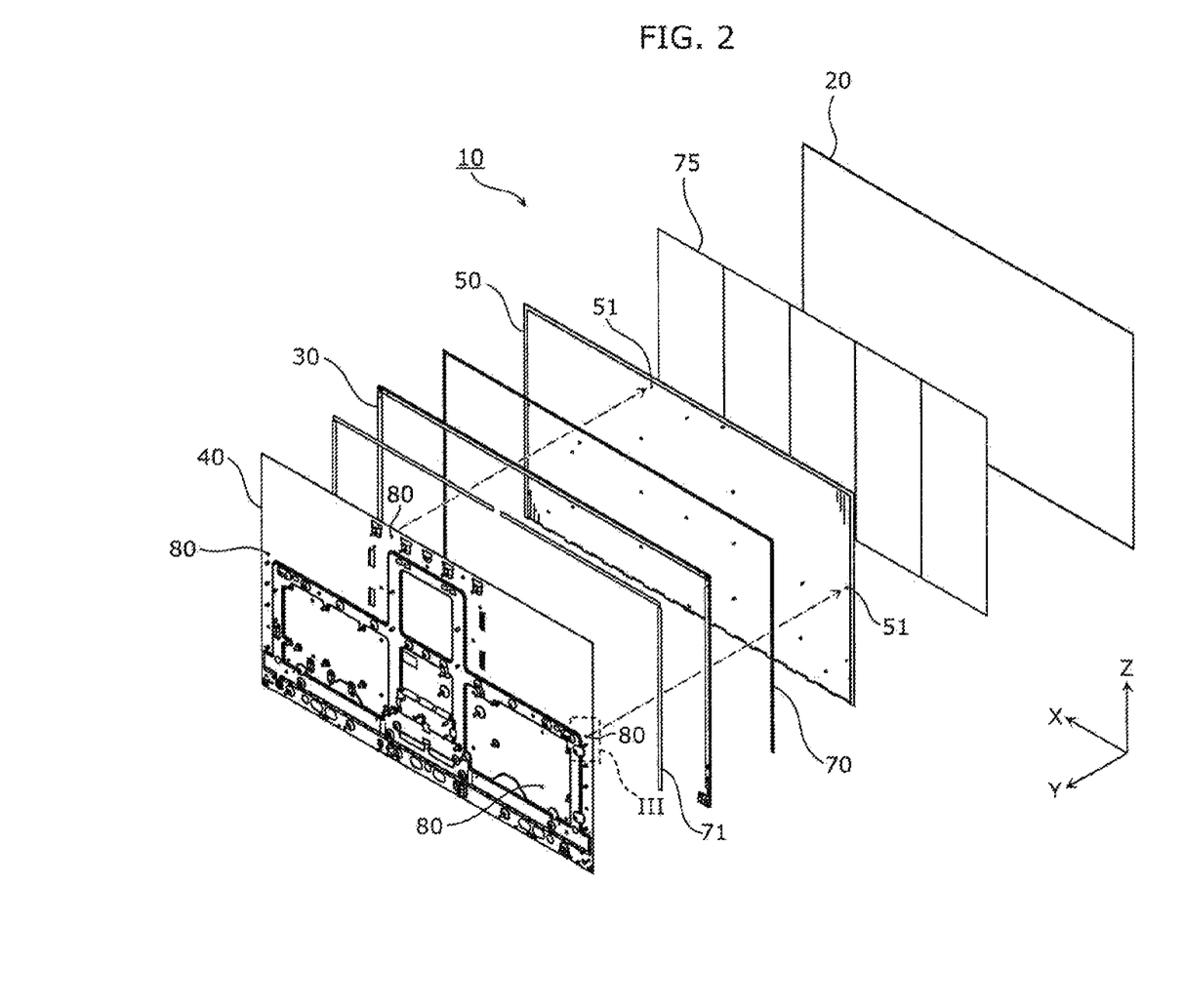
FIG. 2 is an exploded perspective view of the image display device according to the embodiment.

First, an outline of a configuration of image display device 10 according to an embodiment will be described with reference to FIG. 1 and FIG. 2. FIG. 1 is an external perspective view of image display device 10 according to the embodiment. FIG. 2 is an exploded perspective view of image display device 10 according to the embodiment. Specifically, FIG. 2 is an exploded perspective view of image display device 10 when seen diagonally behind.

Image display device 10 according to the present embodiment is a display panel module which includes display panel 20. Image display device 10 is, for example, a device incorporated, as a device which displays an image, into a television receiver, a monitor display or another apparatus.

Specifically, as illustrated in FIG. 1 and FIG. 2, image display device 10 includes display panel 20 which displays an image, heat diffusing plate 50 disposed along the rear surface of display panel 20, and frame 30 disposed along the edge surfaces of display panel 20 and heat diffusing plate 50. Image display device 10 further includes back cover 40 disposed on the rear side of heat diffusing plate 50.

In the present embodiment, display panel 20 is a self-emitting display panel, and specifically is an organic EL panel. In other words, image display device 10 is a display panel module (OLEO module) which includes an organic EL panel. Display panel 20, which is, an organic EL panel, includes, for example, an EL substrate, a glass substrate on which a color filter is formed (CF substrate), a resin layer between the EL substrate and the CF substrate, and a heat dissipating sheet. However, the detailed illustration and description of those elements are omitted.

Image display device 10 also includes electronic components and electronic circuits, such as a source substrate for driving image display on display panel 20 and a timing controller for controlling the source substrate, which are required for image display on display panel 20. However, the detailed illustration and description of those elements are omitted. The timing controller and the source substrate are fixed to, for example, the rear surface of back cover 40.

Back cover 40 is a cover disposed on the rear side of image display device 10 as a display panel module, Back cover 40 is, a component manufactured by, for example, applying press work to a metal component (metal plate) made of aluminum, iron or the like. In the present embodiment, back cover 40 has such a size that the bottom portion of back cover 40 is exposed below display panel 20. Lower cabinet 90 (see FIG. 1) is disposed in front of the portion of back cover 40 which exposes below display panel 20. In other words, lower cabinet 90 is disposed immediately below display panel 20, and is fixed to heat diffusing plate 50 by, for example, a plurality of screws.

Back cover 40 may have design characteristics. For example, back cover 40 may be painted, or a resin or metal thin adhesive sheet or plate may be pasted to, back cover 40. In the case where back cover 40 is painted, black paint allows heat to be more efficiently emitted to the outside by radiation.

Heat diffusing plate 50 is a plate-shaped component disposed on the rear side of display panel 20. In other words, in the present embodiment, heat diffusing plate 50 is disposed between display panel 20 and back cover 40. Heat diffusing plate 50 is a component manufactured by, for example, applying press work to a metal material such as iron or aluminum. Heat diffusing plate 50 is fixed to back cover 40 by a plurality of screws 80. Heat diffusing plate 50 includes screw holes 51 which are threadedly engaged with shaft portions of screws 80. The shaft portions of screws 80 are housed within the thickness of heat diffusing plate 50. In other words, heat diffusing plate 50 has such a thickness that entirely houses the portions of the shaft portions of screws 80 protruding from back cover 40. A configuration in the vicinity of screw 80 in Image display device 10 will be described later with reference to FIG. 4.

In the present embodiment, heat diffusing plate 50 has such a size that covers almost the entire region of the rear surface of display panel 20. Almost the entire region of the front surface of heat diffusing plate 50 is adhered to the rear surface of display panel 20 by adhesive component 75 for fixation. In the present embodiment, as illustrated in FIG. 2, five adhesive sheets elongated in the top and bottom direction (Z-axis direction) are aligned in the left and right direction (X-axis direction). In order to facilitate description, these five adhesive sheets are collectively described as "adhesive component 75". Adhesive component 75 is a component in which adhesives are disposed on both, sides of a resin base material. The number of the adhesive sheets forming adhesive component 75 and the layout of the adhesive sheets are not limited to the number of adhesive sheets and the layout illustrated in FIG. 2. Adhesive component 75 may include, for example, a plurality of adhesive sheets aligned in the top and bottom direction, or may include a single adhesive sheet.

Moreover, frame 30 is disposed so as to surround the upper edge surfaces and the left and right edge surfaces of display panel 20, heat diffusing plate 50, and back cover 40 layered in the front and back direction (Y-axis direction). Frame 30 protects at least the upper edge surfaces and the left and right edge surfaces of display panel 20, heat diffusing plate 50, and back cover 40. Frame 30 is adhered to heat diffusing plate 50 by adhesive tape 70, and is adhered to back cover 40 by adhesive tape 71. Adhesive tapes 70 and 71 are components in which adhesives are disposed on both sides of a resin base material, in a similar manner to adhesive component 75. Frame 30 and back cover 40 are partially fasten to each other by screws, but the detailed description is omitted. Frame 30 is made of, for example, metal, such as aluminum or aluminum alloy, or resin.

Frame 30 supports the peripheral portion of display panel 20 from the rear side, so that display panel 20 is supported without covering the front surface of the peripheral portion of display panel 20. With such a feature, for example, a television receiver including image display device 10 as a display panel module is capable of having a narrower frame. Moreover, heat diffusing plate 50 is disposed on the rear surface of the peripheral portion of display panel 20. This increases the heat dissipation efficiency of display panel 20 as a whole. In such a configuration, in the present embodiment, the peripheral portion of heat diffusing plate 50 and a portion of frame 30 are arranged in such a manner that enhances heat dissipation properties while reducing an increase in thickness of image display device 10. Such a configuration will be described below with reference to FIG. 3 to FIG. 5,

[2. Configuration of Peripheral Portion of Image Display Device]

Figure 3:
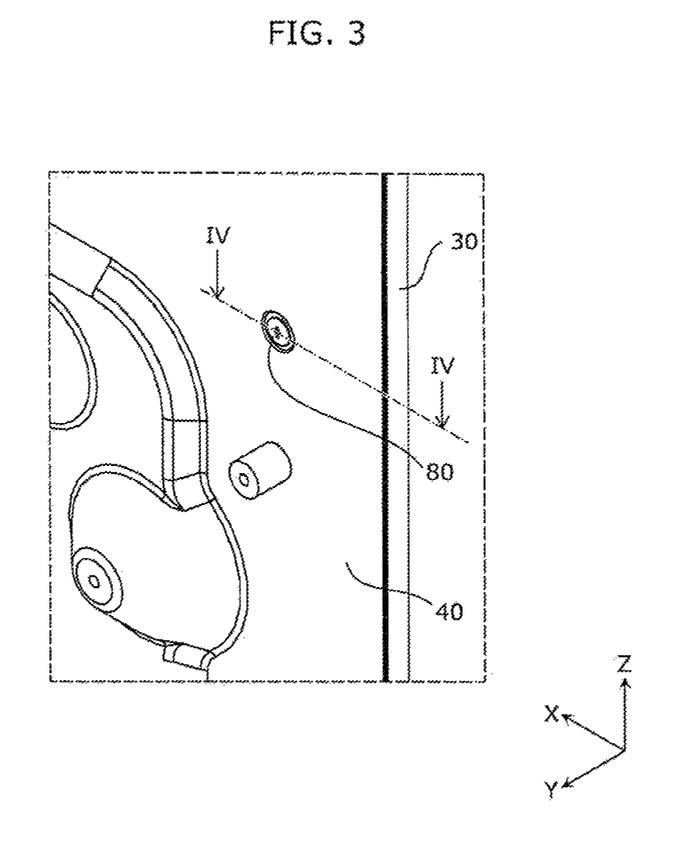
FIG. 3 is a perspective view of part of a peripheral portion of the image display device according to the embodiment.
Figure 4:
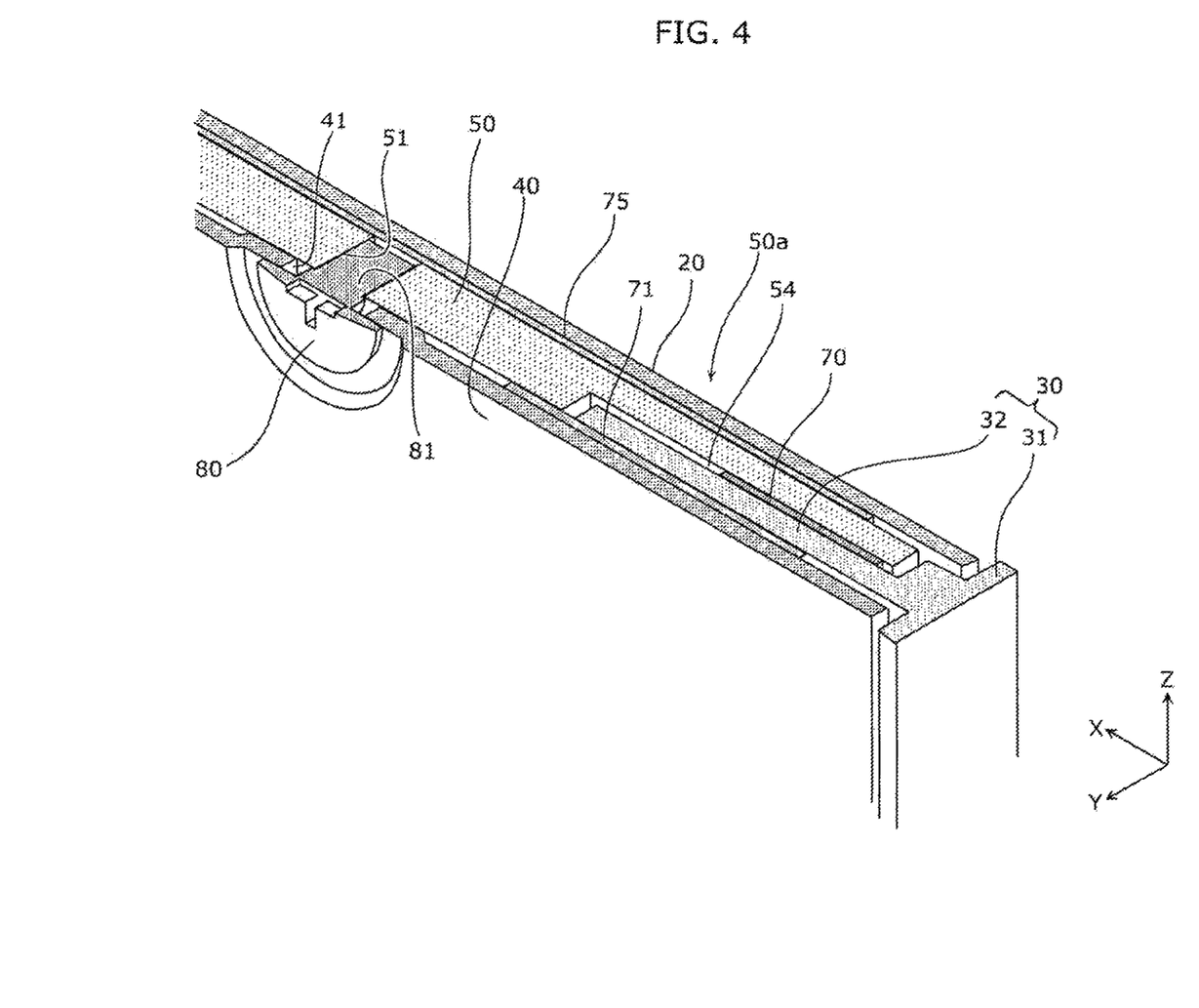
FIG. 4 is a partial cross-sectional view of a configuration of the peripheral portion of the image display device according to the embodiment.

FIG. 3 is a perspective view of a portion of a peripheral portion of image display device 10 according to the embodiment. FIG. 3 illustrates an enlarged view of a portion corresponding to region III surrounded by dotted lines in FIG. 2. FIG. 4 is a partial cross-sectional view of a configuration of a peripheral portion of image display device 10 according to the embodiment. FIG. 4 illustrates a partial cross-section of image display device 10 in the XV plane passing along line IV-IV in FIG. 3, FIG. 5 is an exploded perspective view of image display device 10 corresponding to FIG. 4.

Figure 5:
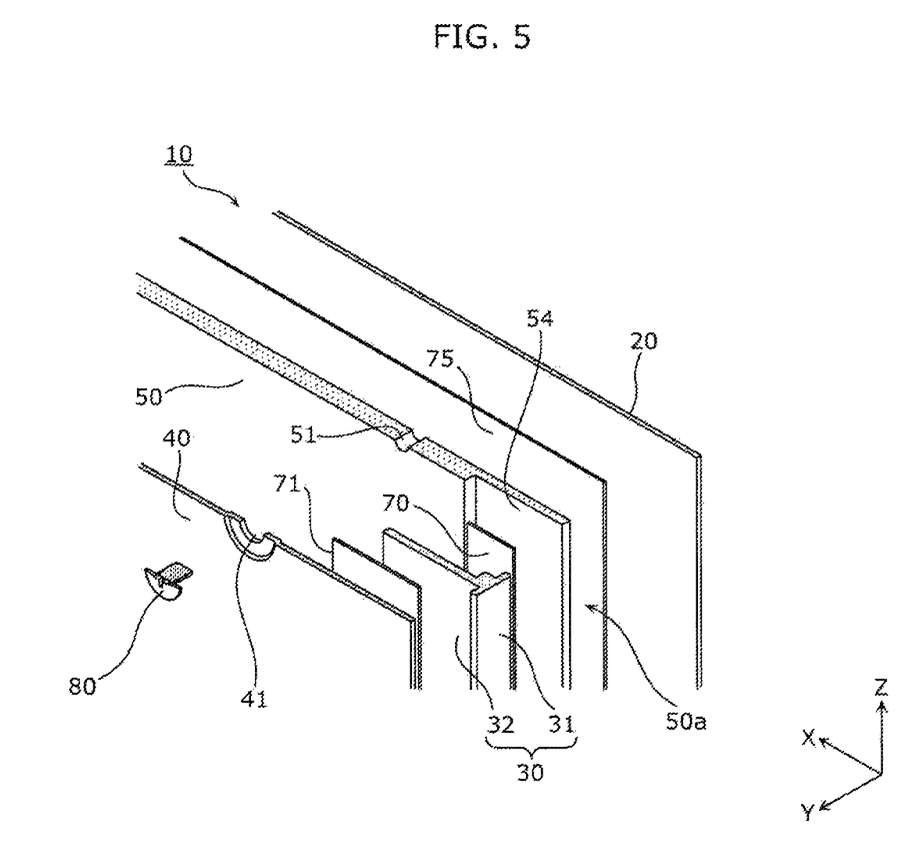
FIG. 5 is an exploded perspective view of the image display device corresponding to FIG. 4.

As illustrated in FIG. 3 to FIG. 5, in the peripheral portion of image display device 10 according to the present embodiment, the edge surfaces of display panel 20, heat diffusing plate 50, and back cover 40 are covered with frame 30.

Specifically, frame 30 includes side wall 31 which is disposed opposite to the edge surfaces of display panel 20 and heat diffusing plate 50, and support wall 32 projecting from side wall 31 toward heat diffusing plate 50. Side wall 31 is a portion which hides and protects the edge surfaces of display panel 20, heat diffusing plate 50, and back cover 40 by covering the edge surfaces. Support wall 32 is a portion which supports the peripheral portion of display panel 20 from the rear side. Specifically, support wall 32 supports the peripheral portion of display panel 20 via peripheral portion 50a of heat diffusing plate 50. More specifically, as illustrated in FIG. 4 and FIG. 5, heat diffusing plate 50 includes, on the rear side (support wall 32 side) of peripheral portion 50a of heat diffusing plate 50, stepped portion 54 which is thinner than other portions. Support wall 32 projecting inward from side wall 31 of frame 30 is housed in stepped portion 54. Support wall 32 and stepped portion 54 are adhered to each other by adhesive tape 70. Almost the entire region of the front surface of heat diffusing plate 50 and the rear surface of display panel 20 are adhered to each other by adhesive component 75. Accordingly, support wall 32 of frame 30 is capable of supporting the peripheral portion of display panel 20 via peripheral portion 50a of heat diffusing plate 50.

As illustrated in FIG. 3 to FIG. 5, heat diffusing plate 50 and back cover 40 are adhered to each other by adhesive tape 71, and are connected to each other by screws 80. Specifically, as illustrated in FIG. 2, FIG. 4, and FIG. 5, back cover 40 includes a plurality of insertion holes 41, and heat diffusing plate 50 includes a plurality of screw holes 51. Shaft portion 81 of screw 80 inserted into insertion hole 41 is threadedly engaged with screw hole 51. Image display device 10 includes a plurality of fastening portions where heat diffusing plate 50 and back cover 40 are fastened by screws 80 as described above.

[3. Advantageous Effects, Etc.]

As described above, image display device 10 according to the present embodiment includes: display panel 20 which displays an image on the front surface of image display panel 20; heat diffusing plate 50 disposed on the rear side of display panel 20; and frame 30 disposed along the edge surfaces of display panel 20 and heat diffusing plate 50. Frame 30 includes side wall 31 which is disposed opposite to the edge, surfaces of display panel 20 and heat diffusing plate 50, and support wall 32 which projects from side wall 31 toward heat diffusing plate 50. Heat diffusing plate 50 includes peripheral portion 50a between support wall 32 and display panel 20. Heat diffusing plate 50 includes, on the rear side of peripheral portion 50a, stepped portion 54 which houses at least part of support wall 32.

With such a configuration, support wall 32 which projects inward from side wall 31 of frame 30 is housed in stepped portion 54 on the rear side of peripheral portion 50a of heat diffusing plate 50. This allows heat diffusing plate 50 to have a size which covers almost the entire region of the rear surface of display panel 20 in front of heat diffusing plate 50. In other words, in the present embodiment, peripheral portion 50a and support wall 32 are layered in the front and back direction instead that the edge surface of heat diffusing plate 50 is recessed to the inner side of support wall 32 so as to avoid interference between heat diffusing plate 50 and support wall 32 of frame 30. In such a configuration, the portion of peripheral portion 50a of heat diffusing plate 50 which overlaps support wall 32 is a stepped shape portion of peripheral portion 50a (stepped portion 54), This prevents an increased thickness due to layering of peripheral portion 50a and support wall 32. In the present embodiment, as illustrated in FIG. 4, stepped portion 54 has such a size that houses support wall 32 entirely in the width direction (X-axis direction) and the thickness direction (Z-axis direction).

Moreover, it is possible to make the front surface of peripheral portion 50a flush with the front surface of the portion inner than peripheral portion 50a. Hence, the entire region of the front surface of heat diffusing plate 50 can be flattened. Accordingly, the entire region of heat diffusing plate 50 including peripheral portion 50a can be disposed along the rear surface of display panel 20, This leads to efficient heat dissipation of display panel 20. Moreover, it is possible to make the thickness of the portion of heat diffusing plate 50 which is not layered with support wall 32 relatively large, allowing an increase in heat exchange amount by heat diffusing plate 50. This also allows efficient heat dissipation of display panel 20.

As described above, image display device 10 according to the present embodiment is capable of enhancing heat dissipation properties while reducing an increase in thickness.

Image display device 10 according to the present embodiment includes adhesive component 75 disposed between display panel 20 and heat diffusing plate 50. Adhesive component 75 is disposed in a region including at least part of the front surface of peripheral portion 50a of heat diffusing plate 50. The region occupies more than half of the area of the front surface of heat diffusing plate 50.

With such a configuration, in heat diffusing plate 50 with Peripheral portion 50a having a size and a shape disposed between support wall 32 of frame 30 and display panel 20, a relatively large region on the front surface of heat diffusing plate 50 is adhered to display panel 20 by adhesive component 75. In other words, a relatively large region on the rear surface of display panel 20 is adhered to heat diffusing plate 50 by adhesive component 75.

Accordingly, heat diffusing plate 50 can be arranged closer to display panel 20, leading to more efficient heat dissipation by heat diffusing plate 50. Specifically, it is assumed that adhesive sheets each having a small area are dispersed between display panel 20 and heat diffusing plate 50, and display panel 20 is disposed close to heat diffusing plate 50. In such a case, heat dissipation properties significantly differ in display panel 20 between the portions where the adhesive sheets are disposed on the rear side and the portions where no adhesive sheet is disposed (where an air layer is present). As a result, color unevenness, luminance unevenness, or the like is likely to be noticeable in display panel 20. Hence, conventionally, for example, display panel 20 and heat diffusing plate 50 are spaced from each other by using an adhesive sheet (adhesive tape) thicker than adhesive component 75. For example, in the case where adhesive component 75 according to the present embodiment has a thickness of 0.3 mm, a conventional adhesive sheet (adhesive tape) which adheres the display panel and the heat diffusing plate has a thickness of at least 0.5 mm. However, in the present embodiment, adhesive component 75 is disposed in a relatively large region on the rear surface of display panel 20, and thus, unevenness in heat dissipation properties is less likely to occur in display panel 20. Accordingly, even when heat diffusing plate 50 and display panel 20 are arranged close to each other by reducing the thickness of adhesive component 75, color unevenness, luminance unevenness or the like is prevented from occurring. This effect is generated when the arrangement area of adhesive component 75 occupies at least half of the area of the front surface of heat diffusing plate 50, for example, and becomes more remarkable as a ratio of the arrangement area to the front surface increases. Hence, in the present embodiment, as illustrated in FIG. 2 and FIG. 4, adhesive component 75 is arranged such that almost the entire region of the front surface of heat diffusing plate 50 and almost the entire region of the rear surface of display panel 20 are adhered to each other.

Arranging display panel 20 and heat diffusing plate 50 close to each other as described above is advantageous in reducing the thickness of image display device 10. Moreover, by reducing the thickness of adhesive component 75, for example, while reducing an increase in thickness of image display device 10, the thickness of the portion of heat diffusing plate 50 other than stepped portion 54 can be further increased.

Image display device 10 according to the present embodiment further includes back cover 40 disposed on the rear side of heat diffusing plate 50. Back cover 40 has a thickness less than the thickness of heat diffusing plate 50. In other words, the thickness of the plate-shaped component forming back cover 40 is less than the thickness of heat diffusing plate 50 (the thickness of the portion other than stepped portion 54).

In the present embodiment, as described above, stepped portion 54 of peripheral portion 50a of heat diffusing plate 50 is layered on support wall 32 of frame 30 in the front and back direction. Hence, the thickness of the portion of heat diffusing plate 50 other than stepped portion 54 can be increased. Accordingly, for example, stiffness as a structure required in image display device 10 can be ensured by heat diffusing plate 50. As a result, the thickness of back cover 40 can be reduced. This point is advantageous in preventing an increase in thickness or reducing the thickness of image display device 10.

In the present embodiment, back cover 40 includes insertion holes 41 into which shaft portions 81 of screws 80 are inserted. Heat diffusing plate 50 includes screw holes 51 which are threadedly engaged with shaft portions 81 of screws 80 inserted into insertion holes 41. Each of screw holes 51 has a length which prevents the tip of shaft portion 81 from being exposed.

In the present embodiment, as descried above, the thickness of heat diffusing plate 50 is relatively large. This allows screw hole 51 to have a length which prevents the tip of shaft portion 81 of screw 80 from being exposed, as illustrated in FIG. 4. Accordingly, for example, without providing a protruding bulging portion (boss) in heat diffusing plate 50 on the back cover 40 side, back cover 40 can be screwed to heat diffusing plate 50. In other words, if heat diffusing plate 50 has a boss, the rear side of the boss is the region which is not adhered to display panel 20. This hinders maintaining or increasing of the heat dissipation properties of display panel 20. In this regard, in the present embodiment, heat diffusing plate 50 does not require bosses for screwing. As a result, decrease in heat dissipation properties due to presence of the bosses in heat diffusing plate 50 does not occur. Moreover, a portion of heat diffusing plate 50 and a portion of back cover 40 can be brought in close contact with each other by the fastening force of screws 88. This allows heat diffusing plate 50 and back cover 40 to be adhered to each other more firmly, and also allows efficient heat conduction from heat diffusing plate 50 to back cover 40. This is advantageous in enhancing the heat dissipation properties of display panel 20.

In the present embodiment, as illustrated in FIG. 4 and FIG. 5, screw holes 51 of heat diffusing plate 50 penetrate heat diffusing plate 50. However, screw holes 51 do not have to penetrate heat diffusing plate 50. In other words, each of screw holes 51 may be a hole having a bottom and having an opening only in the rear surface of heat diffusing plate 50. In this case, the portions of the front surface of heat diffusing plate 50 corresponding to screw holes 51 do not have openings. Accordingly, the area of the portion of heat diffusing plate 50 disposed along the rear surface of display panel 20 is increased. This point contributes to an enhancement in heat dissipation properties of display panel 20.

Other Embodiments

As described above, the embodiment has been described as an example of the technique disclosed in the present application. The technique in the present disclosure, however, is not limited to such an example, and is also applicable to embodiments to which various kinds of modifications, replacements, additions, deletions and the like have appropriately been made. Moreover, each structural element described in, the above embodiment may be combined to obtain a new embodiment. Another embodiment will be described below as an example.

For example, the adhesive layer which adheres heat diffusing plate 50 and display panel 20 does not have to be a component which uses adhesive, such as an adhesive sheet or an adhesive tape. For example, heat diffusing plate 50 and display panel 20 may be adhered to each other by a silicone adhesive with a high thermal conductivity.

Components (adhesive tapes 70 and 71 and adhesive component 75), which adhere adjacent components of back cover 40, support wall 32 of frame 30, heat diffusing plate 50, and display panel 20, are non essential. For example, back cover 40 and support wall 32 of frame 30 may be connected to each other by engagement or fitting. Moreover, for example, display panel 20 and heat diffusing plate 50 may be configured to be closely contact to each other by such a structural mechanism that the entire region of the peripheral portion of display panel 20 is pressed against heat diffusing plate 50 by the frame, without using adhesive component 75.

Frame 30 may have a rectangular shape which surrounds the upper and tower edge surfaces and left and right edge surfaces of heat diffusing plate 50 and back cover 40. Moreover, frame 30 may include separate components in light of ease of assembly.

In the case where the television receiver, the monitor display, or the like into which image display device 10 is incorporated includes a frame component along the edge surfaces of display panel 20 and heat diffusing plate 50 which are layered, image display device 10 may use the frame component as a frame.

Display panel 20 may be a different kind of display panel from an organic EL panel. For example, a light emitting diode (LED) display panel including three kinds of LEDs which are arranged in a matrix and emit red, blue, and green light may be disposed in image display device 10 as display panel 20.

As described above, embodiments have been described as examples of the technique in the present disclosure. For this purpose, the accompanying drawings and detailed description are provided.

Accordingly, the structural elements described in the accompanying drawings and detailed description may include not only structural elements which are essential for solving the problem but also structural elements which are not essential for solving the problem but are provided for illustrating the technique. Therefore, the non-essential structural elements described in the attached drawings and/or the detailed description should not be instantly acknowledged to be essential structural elements.

Since the above embodiments are intended to illustrate the technique in the present disclosure, is possible to make various kinds of modifications, replacements, additions, deletions, and the like within the scope of the claims or an equivalent scope thereof.

INDUSTRIAL APPLICABILITY

The present disclosure is applicable to an image display device included in, for example, a television receiver; a monitor display, or a digital signage.

The invention claimed is:
1. An image display device, comprising:
a display panel which displays an image on a front surface of the display panel;
a heat diffusing plate which is disposed on a rear side of the display panel; and
a frame which is disposed along an edge surface of the display panel and an edge surface of the heat diffusing plate,
wherein the frame includes:
a side wall which is disposed opposite to the edge surface of the display panel and the edge surface of the heat diffusing plate; and
a support wall which projects from the side wall toward the heat diffusing plate,
the heat diffusing plate includes a first portion and a peripheral portion, the peripheral portion being disposed between the support wall and the display panel, the first portion having a thickness dimension which is larger than the thickness dimension of the peripheral portion, the thickness dimension of the peripheral portion being constant, and
the peripheral portion housing at least part of the support wall.

2. An image display device, comprising:
a display panel which displays an image on a front surface of the display panel;
a heat diffusing plate which is disposed on a rear side of the display panel;
a frame which is disposed along an edge surface of the display panel and an edge surface of the heat diffusing plate; and
an adhesive component which is disposed between the display panel and the heat diffusing plate,
wherein the frame includes:
a side wall which is disposed opposite to the edge surface of the display panel and the edge surface of the heat diffusing plate; and
a support wall which projects from the side wall toward the heat diffusing plate,
the heat diffusing plate includes a peripheral portion which is disposed between the support wall and the display panel,
the peripheral portion includes a stepped portion on a rear side of the peripheral portion, the stepped portion housing at least part of the support wall, and
the adhesive component is disposed in a region which includes at least part of a front surface of the peripheral portion, the region occupying at least half of an area of a front surface of the heat diffusing plate.

3. The image display device according to claim 1, further comprising:
a back cover which is disposed on a rear side of the heat diffusing plate,
wherein the back cover has a thickness less than a thickness of the heat diffusing plate.

4. The image display device according to claim 3,
wherein the back cover includes an insertion hole into which a shaft portion of a screw is inserted, and
the heat diffusing plate includes a screw hole which is threadedly engaged with the shaft portion of the screw inserted into the insertion hole, the screw hole having a length which prevents a tip of the shaft portion from being exposed.

5. The image display device according to claim 2, further comprising:
a back cover which is disposed on a rear side of the heat diffusing plate,
wherein the back cover has a thickness less than a thickness of the heat diffusing plate.

6. The image display device according to claim 5,
wherein the back cover includes an insertion hole into which a shaft portion of a screw is inserted, and
the heat diffusing plate includes a screw hole which is threadedly engaged with the shaft portion of the screw inserted into the insertion hole, the screw hole having a length which prevents a tip of the shaft portion from being exposed.

7. An image display device, comprising:
a display panel which displays an image on a front surface of the display panel;
a heat diffusing plate which is disposed on a rear side of the display panel; and
a frame which is disposed along an edge surface of the display panel and an edge surface of the heat diffusing plate,
wherein the frame includes:
a side wall which is disposed opposite to the edge surface of the display panel and the edge surface of the heat diffusing plate; and
a support wall which projects from the side wall toward the heat diffusing plate, the heat diffusing plate includes a first portion and a peripheral portion, the peripheral portion being disposed between the support wall and the display panel, the first portion having a thickness dimension which is larger than the thickness dimension of the peripheral portion, the thickness dimension of the peripheral portion being constant, the peripheral portion housing at least part of the support wall, and the heat diffusing plate has a size that covers almost an entire region of a rear surface of the display panel.

8. The image display device according to claim 7, wherein the display panel is a self-emitting display panel.

9. The image display device according to claim 8, further comprising:
 a back cover which is disposed on a rear side of the heat diffusing plate,
 wherein the back cover has a thickness less than a thickness of the heat diffusing plate.

10. The image display device according to claim 9, wherein the back cover includes an insertion hole into which a shaft portion of a screw is inserted, and the heat diffusing plate includes a screw hole which is threadedly engaged with the shaft portion of the screw inserted into the insertion hole, the screw hole having a length which prevents a tip of the shaft portion from being exposed.

11. The image display device according to claim 1, wherein an upper surface of the first portion of the heat diffusing plate includes a first edge and a second edge, which extend parallel to one another, and an upper surface of the peripheral portion of the heat diffusing plate includes a first edge and a second edge, which extend parallel to one another, and the first edge of the first portion and first edge of the peripheral portion extending parallel to one another, and the second edge of the first portion and second edge of the peripheral portion extending parallel to one another.

12. The image display device according to claim 7, wherein an upper surface of the first portion of the heat diffusing plate includes a first edge and a second edge, which extend parallel to one another, and an upper surface of the peripheral portion of the heat diffusing plate includes a first edge and a second edge, which extend parallel to one another, and the first edge of the first portion and first edge of the peripheral portion extending parallel to one another, and the second edge of the first portion and second edge of the peripheral portion extending parallel to one another.

* * * * *